(12) United States Patent
Kinoshita et al.

(10) Patent No.: US 9,468,994 B2
(45) Date of Patent: Oct. 18, 2016

(54) SENSOR UNIT, METHOD OF MANUFACTURING THE SAME, ELECTRONIC APPARATUS, AND MOVING OBJECT

(71) Applicant: Seiko Epson Corporation, Tokyo (JP)

(72) Inventors: Yusuke Kinoshita, Minowa (JP); Yoshihiro Kobayashi, Komagane (JP); Yoshikuni Saito, Suwa (JP); Masayasu Sakuma, Shiojiri (JP)

(73) Assignee: Seiko Epson Corporation (JP)

( * ) Notice: Subject to any disclaimer, the term of this patent is extended or adjusted under 35 U.S.C. 154(b) by 221 days.

(21) Appl. No.: 14/263,416

(22) Filed: Apr. 28, 2014

(65) Prior Publication Data

US 2014/0347823 A1 Nov. 27, 2014

(30) Foreign Application Priority Data

May 24, 2013 (JP) .................................. 2013-110293

(51) Int. Cl.
*H05K 7/00* (2006.01)
*B23K 26/20* (2014.01)
(Continued)

(52) U.S. Cl.
CPC ........... *B23K 26/203* (2013.01); *B23K 1/0016* (2013.01); *B23K 1/0056* (2013.01); *B23K 26/211* (2015.10); *H05K 1/18* (2013.01); *H05K 1/181* (2013.01); *H05K 3/3405* (2013.01); *H05K 1/117* (2013.01); *H05K 2201/10015* (2013.01); *H05K 2201/10022* (2013.01); *H05K 2201/1053* (2013.01); *H05K 2201/10151* (2013.01); *H05K 2201/10189* (2013.01); *H05K 2201/10446* (2013.01); *Y02P 70/611* (2015.11)

(58) Field of Classification Search
CPC B23K 1/0016; B23K 1/0056; B23K 26/203; B23K 26/211; H05K 1/117; H05K 1/18; H05K 1/181; H05K 2201/10015; H05K 2201/10022; H05K 2201/10151; H05K 2201/10189; H05K 2201/10446; H05K 2201/1053
USPC .................. 361/748, 760, 772; 174/250, 260
See application file for complete search history.

(56) References Cited

U.S. PATENT DOCUMENTS

2004/0169244 A1* 9/2004 MacGugan ........... B81B 7/0074
257/416
2005/0122100 A1* 6/2005 Wan .................... G01R 33/0206
324/247

(Continued)

FOREIGN PATENT DOCUMENTS

| JP | 05-340960 A | 12/1993 |
|---|---|---|
| JP | 07-306047 A | 11/1995 |

(Continued)

*Primary Examiner* — Yuriy Semenenko
(74) *Attorney, Agent, or Firm* — Harness, Dickey & Pierce, P.L.C.

(57) ABSTRACT

A sensor unit is provided with a sensor device. The sensor device has a first electrode disposed on an outer surface. A board is provided with a first surface and a second surface in an obverse-reverse relationship with each other, and a side surface. A first conductive terminal is disposed along a contour of the first surface. The sensor device has the outer surface disposed along the side surface of the board, and has the first electrode connected to the first conductive terminal with a first conductive body, and a first projection length of the outer surface projecting on the first surface side is smaller than a second projection length of the outer surface projecting on the second surface side.

10 Claims, 9 Drawing Sheets

(51) Int. Cl.
  *B23K 1/00* (2006.01)
  *B23K 1/005* (2006.01)
  *H05K 1/18* (2006.01)
  *H05K 3/34* (2006.01)
  *H05K 1/11* (2006.01)

(56) References Cited

U.S. PATENT DOCUMENTS

2005/0156306 A1* 7/2005 Miyazawa ............. G01C 21/26
  257/691
2008/0311771 A1* 12/2008 Cho ....................... H01R 12/57
  439/74
2011/0077820 A1* 3/2011 Tokui ...................... G01P 1/023
  701/36
2014/0003018 A1* 1/2014 Fujimori ................ A61B 1/051
  361/783

FOREIGN PATENT DOCUMENTS

| JP | 11-211481 A | 8/1999 |
| JP | 11-289141 A | 10/1999 |
| JP | 2001-102746 A | 4/2001 |
| JP | 2002-009228 A | 1/2002 |
| JP | 2004-163367 A | 6/2004 |
| JP | 2005-197493 A | 7/2005 |

* cited by examiner

SENSOR UNIT, METHOD OF MANUFACTURING THE SAME, ELECTRONIC APPARATUS, AND MOVING OBJECT

BACKGROUND

1. Technical Field

The present invention relates to a sensor unit, a method of manufacturing the sensor unit, and an electronic apparatus, a moving object, and so on using the sensor unit.

2. Related Art

Document 1 discloses a mounting structure of a gyro package. In the mounting structure disclosed in FIGS. 1A and 1B of JP-A-2004-163367 (Document 1), an opening is provided to a board, and a gyro package in a vertical posture is inserted in the opening. An outer surface of the gyro package has a quadrangular contour. The board is pressed against the gyro package on a bisector of the contour. In other words, a projection length of the gyro package projecting from an upper surface of the board and a projection length of the gyro package projecting from a lower surface of the board are equal to each other. Further, in the mounting structure disclosed in FIG. 4 showing another embodiment of Document 1, the gyro package is mounted to a fixation board, and the gyro package is supported in the vertical posture by fitting a connector provided to the fixation board and a connector provided to a circuit board to each other.

Although in existing gyro packages, the length of terminals disposed on the reverse side is typically shorter than the width center of the package, it is necessary in the mounting structure shown in FIGS. 1A and 1B of Document 1 to extend the electrodes provided to the gyro package to the vicinity of the bisector of the contour, and therefore, the existing gyro packages are not available. Therefore, it is necessary to design new terminals of the gyro package. Further, since it is necessary to provide an opening to the board, and accurately control the perpendicularity of an inside surface of the opening, there is a difficulty in manufacturing.

Further, in the mounting structure shown in FIG. 4 of Document 1, since there is adopted a structure of fitting the connector provided to the fixation board and the connector provided to the circuit board to each other, there are a problem that it is necessary to additionally provide connector members, and a problem that it is not achievable to ensure the vertical posture of the gyro package unless the connectors are correctly fitted each other.

SUMMARY

An advantage of some aspects of the invention is to solve at least one of the problems described above and to provide a sensor unit small in size, low in height, and making the existing gyro packages available.

(1) An aspect of the invention relates to a sensor unit including a sensor device provided with a first electrode disposed on an outer surface, and a board having a first surface and a second surface in an obverse-reverse relationship with each other, and a side surface, and provided with a first conductive terminal arranged along a contour of the first surface, the sensor device has the outer surface disposed on the side surface of the board, and has the first electrode connected to the first conductive terminal with a first conductive body, and a first projection length of the outer surface projecting on the first surface side is smaller than a second projection length of the outer surface projecting on the second surface side.

Even in the case in which the electrode disposed on the outer surface of the sensor device is as short as in the related art, the first electrode of the sensor device and the first conductive terminal of the board can surely be electrically and mechanically fixed to each other with the first conductive body by mounting the sensor device so as to be deviated from the side surface of the board, and thus, a sensor module small in size and low in height can be provided using the existing sensor packages.

(2) In the sensor unit, a first electronic component may be mounted on the first surface of the board, and a maximum thickness of the first electronic component may be equal to or smaller than the first projection length.

(3) A second electronic component may be mounted on the second surface of the board, and a maximum thickness of the second electronic component may be equal to or smaller than the second projection length. Thus, the height of the sensor unit can be controlled by the projection length of the sensor device projecting on the first surface side or the second surface side of the board, which makes a significant contribution to the reduction of the height of the sensor unit.

(4) The sensor device may be provided with a second electrode disposed on the outer surface projecting on the second surface side, the board may be provided with a second conductive terminal disposed along a contour of the second surface, and the second electrode and the second conductive terminal may be connected to each other with a second conductive body. Thus, the electrical and mechanical connection to the sensor device can surely be achieved on both surfaces of the board, and at the same time, the bonding strength of the sensor device can be increased.

(5) The second electrode and the second conductive terminal may be connected to each other via a connection member. Thus, since it is not required to make the second electrode of the sensor device extend to the bisector of the contour, existing sensor packages can be used without modification.

(6) The connection member may be at least one of a chip resistor and a chip capacitor. Thus, since it is not required to make the second electrode of the sensor device extend to the bisector of the contour, there is obtained an advantage that existing sensor packages can be used without modification while improving the electrical characteristics of the sensor device using the chip resistor or the chip capacitor.

(7) The sensor device may include a first sensor device disposed on a first side surface of the board, and a second sensor device disposed on a second side surface of the board intersecting with the first side surface.

In general, as the sensor device having a single detection axis, there can be cited a sensor device having a detection axis parallel to the outer surface to be the connection surface, and a sensor device having a detection axis perpendicular to the outer surface to be the connection surface. It is desirable that sensor devices of the same type are used in one sensor unit. For example, if the sensor devices each having the detection axis perpendicular to the outer surface to be the connection surface are used as the first sensor device and the second sensor device, the contour of the board is used, and the detection axes can easily constitute the orthogonal axes.

(8) The board may have a rectangular shape, and the first sensor device and the second sensor device may be disposed respectively on the two side surfaces of the board adjacent to each other. The first sensor device and the second sensor device are disposed close to each other on the board. As a result, the first sensor device and the second sensor device are connected to a common electronic circuit with the shortest distance.

(9) The contour of the board may be provided with a recessed portion having a depth larger than a thickness of the sensor device, and the sensor device may be disposed in the recessed portion. The projection of the sensor device from a typical shape of the board can be avoided.

(10) A third sensor device as the sensor device may be mounted on one of the first surface and the second surface of the board, and an integrated circuit may be mounted on the other of the first surface and the second surface of the board. Thus, since the sensor device and the integrated circuit are not mounted on the same surface, but can respectively be mounted on different surfaces, a harmful influence of the heat radiation from the integrated circuit exerted on the sensor device can be reduced.

(11) The sensor unit as described above may be used by being incorporated in an electronic apparatus.

It is sufficient for such an electronic apparatus to be equipped with the sensor unit described above as a constituent.

(12) The sensor unit may be used by being incorporated in a moving object. It is sufficient for such a moving object to be equipped with the sensor unit described above as a constituent.

(13) Another aspect of the invention relates to a method of manufacturing a sensor unit including providing a sensor device having a first electrode disposed on an outer surface, and a board having a first surface and a second surface in an obverse-reverse relationship with each other, and a side surface, and provided with a first conductive terminal arranged along a contour of the first surface, disposing the outer surface of the sensor device on the side surface of the board, and irradiating obliquely the first conductive terminal and the first electrode with a laser beam to melt a conductive material to form a conductive body adapted to connect the first electrode and the first conductive terminal to each other. According to this manufacturing method, a sensor unit having at least one of the advantages described above is manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, some embodiments of the invention will be explained with reference to the accompanying drawings. It should be noted that the present embodiment explained below does not unreasonably limit the content of the invention as set forth in the appended claims, and all of the constituents set forth in the present embodiments are not necessarily essential as means for solving the problem according to the invention.

1. Configuration of Sensor Unit

Figure 1:
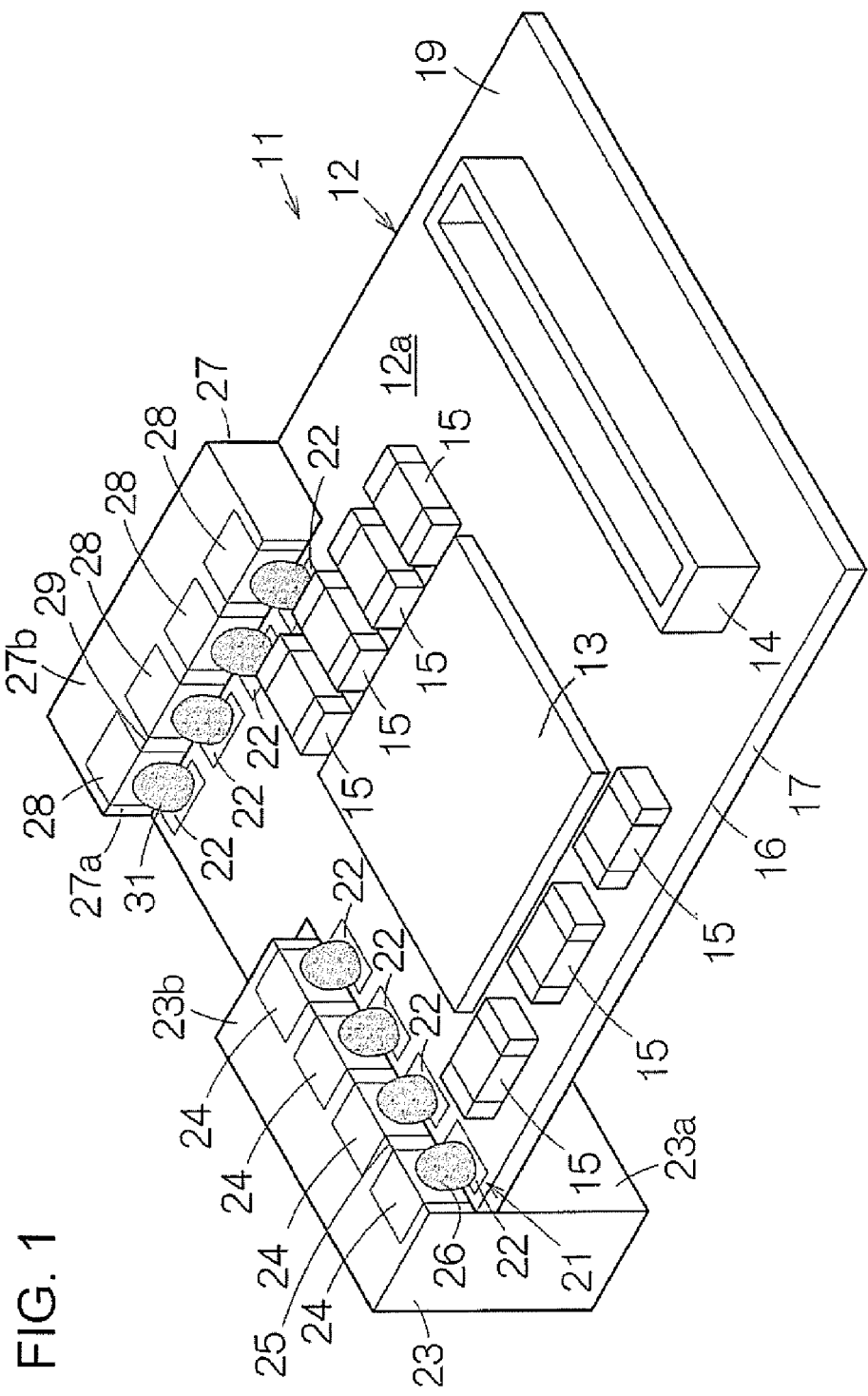
FIG. 1 is a perspective view of a sensor unit according to an embodiment of the invention viewed from a first surface of a board.

FIG. 1 is a perspective view schematically showing an appearance of a sensor unit according to an embodiment of the invention. The sensor unit 11 is provided with a board 12. On an obverse surface 12a as a first surface of the board 12, there are mounted an IC chip (an electronic circuit) 13, a connector 14, other electronic components 15 such as chip resistors or chip capacitors. The board 12 has an end surface 17 as a side surface along an edge 16 of the obverse surface 12a. The end surface 17 is contiguous with the edge 16 of the obverse surface 12a. The end surface 17 is perpendicular to the obverse surface 12a of the board 12. Therefore, the edge 16 of the obverse surface 12a forms a ridge line between the obverse surface 12a and the end surface 17. The end surface 17 is continuous along the contour of the board 12. It should be noted that the end surface 17 can intersect with the obverse surface 12a of the board 12 at a predetermined tilt angle.

The board 12 is provided with a board main body 19. The board main body 19 is formed of an insulating material such as resin or ceramic. On the obverse surface of the board main body 19, there is formed a wiring pattern 21. The wiring pattern 21 is formed of a conductive material using, for example, a film formation process by plating. The IC chip 13, the connector 14, and other electronic components 15 are electrically connected to each other with the wiring pattern 21. The wiring pattern 21 includes conductive terminals 22 as first conductive terminals extending toward the edge 16 of the board 12. The conductive terminals 22 can reach the edge 16 of the board 12, or can be terminated at positions separated from the edge 16.

The sensor unit 11 is provided with a first sensor device 23. The first sensor device 23 has a flat cuboid outer shape. The contour of an outer surface 23a is formed to have a rectangular shape. The first sensor device 23 is provided with a plurality of electrodes (first electrodes) 24 as first electrodes. The electrodes 24 are arranged in a line along a long side 25 of the contour of the outer surface 23a. Each of the electrodes 24 can also extend from the outer surface 23a to another outer surface (a side surface) 23b beyond a ridge line. The end surface 17 of the board 12 has contact with, and is pressed against the outer surface 23a of the first sensor device 23. Thus, the outer surface 23a of the first sensor device 23 intersects with the obverse surface of the board main body 19 at a right angle. The long side 25 of the contour extends in parallel to the obverse surface of the board main body 19. The electrodes 24 are disposed between the long side 25 of the contour and the edge 16 of the board 12.

A conductive body 26 as a first conductive body is bonded to each of the electrodes 24. The conductive body 26 is bonded to corresponding one of the conductive terminals 22. The conductive body 26 is formed of, for example, a conductive material, which can be melted with the energy of a laser beam. Here, a solder material is used as the conductive material. The conductive body 26 individually connects each of the electrodes 24 and corresponding one of the conductive terminals 22 to each other.

The sensor unit 11 is provided with a second sensor device 27. The second sensor device 27 has the same structure as the structure of the first sensor device 23. In other wards, the second sensor device 27 has a flat cuboid outer shape. The contour of an outer surface 27a is formed to have a rectangular shape. The second sensor device 27 is provided with a plurality of electrodes (the first electrodes) 28. The electrodes 28 are arranged in a line along a long side 29 of the rectangular contour. Each of the electrodes 28 can also extend from the outer surface 27a to another outer surface (a side surface) 27b beyond a ridge line. The end surface 17 of the board 12 has contact with, and is pressed against the outer surface 27a of the second sensor device 27. Thus, the outer surface 27a of the second sensor device 27 intersects with the obverse surface of the board main body 19 at a right angle. The long side 29 of the contour extends in parallel to the obverse surface of the board main body 19. The electrodes 28 are disposed between the long side 29 of the contour and the edge 16 of the board 12.

A conductive body 31 as the first conductive body is bonded to each of the electrodes 28. The conductive body 31 is bonded to corresponding one of the conductive terminals 22. The conductive body 31 is formed of, for example, a conductive material, which can be melted with the energy of a laser beam. Here, a solder material is used as the conductive material. The conductive body 31 individually connects each of the electrodes 28 and corresponding one of the conductive terminals 22 to each other.

Figure 2:
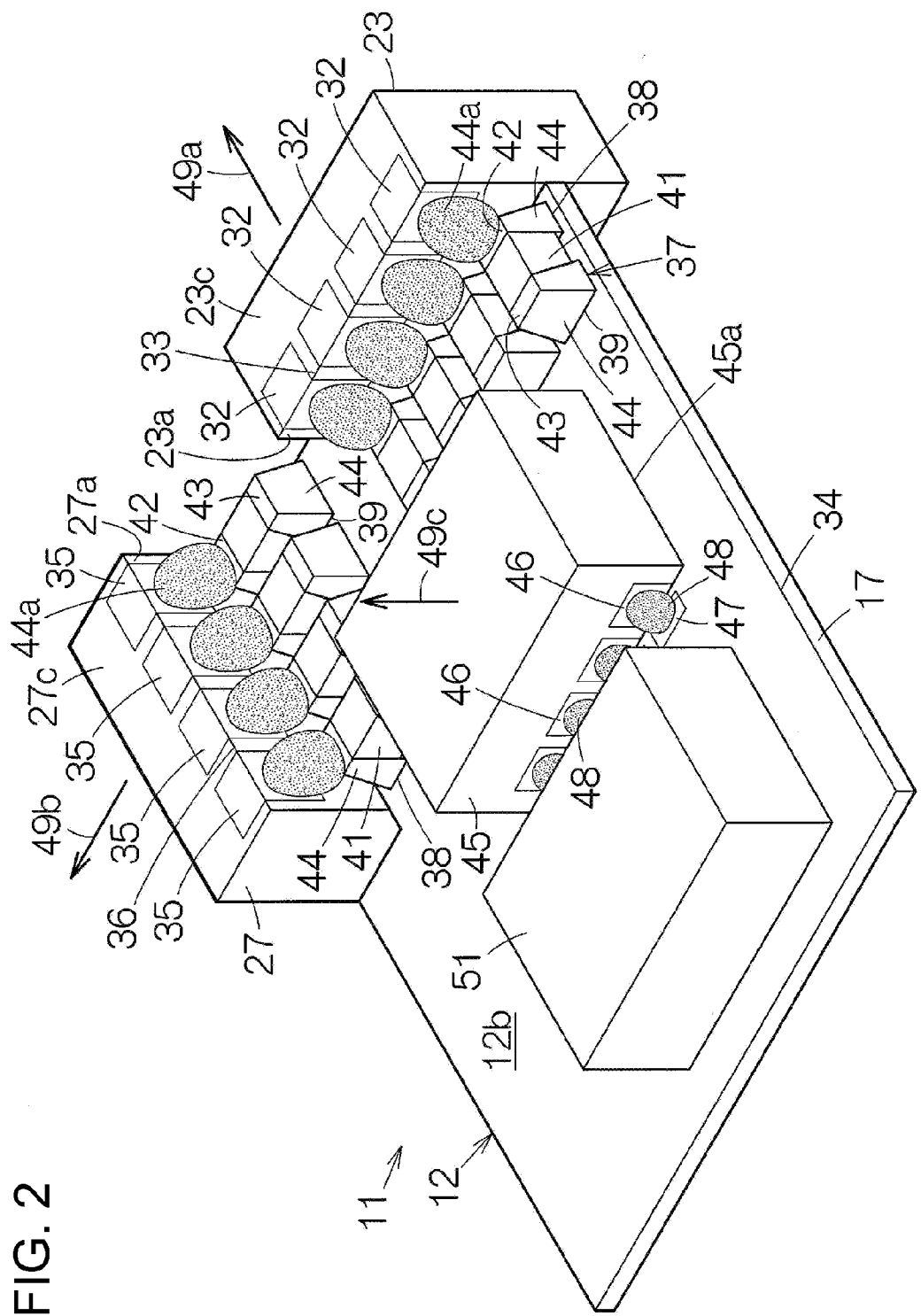
FIG. 2 is a perspective view of the sensor unit viewed from a second surface, the opposite side to the first surface.

FIG. 2 is a diagram of the board 12 viewed from a reverse surface side. As shown in FIG. 2, the first sensor device 23 is further provided with a plurality of electrodes (second electrodes) 32. The electrodes 32 are arranged in a line along an other long side (hereinafter referred to as "another long side") 33 of the outer surface 23a. Each of the electrodes 32 can also extend from the outer surface 23a to another outer surface (a side surface) 23c beyond a ridge line. The outer surface 23c extends in parallel to the outer surface 23b. The another long side 33 of the contour extends in parallel to the reverse surface of the board main body 19. An edge 34 of the reverse surface (the surface on the reverse side) 12b as a second surface of the board 12 is contiguous with the end surface 17 as a side surface. The end surface 17 is perpendicular to the reverse surface 12b of the board 12. The edge 34 of the reverse surface 12b forms a ridge line between the reverse surface 12b and the end surface 17. Each of the electrodes 32 extends from the another long side 33 of the contour toward the edge 34 of the board 12. The electrodes 32 are formed to have the same size as the size of the electrodes 24.

Similarly, the second sensor device 27 is provided with a plurality of electrodes (the second electrodes) 35. The electrodes 35 are arranged in a line along another long side 36 of the outer surface 27a. Each of the electrodes 35 can also extend from the outer surface 27a to another outer surface (a side surface) 27c beyond a ridge line. The another long side 36 of the contour extends in parallel to the reverse surface of the board main body 19. Each of the electrodes 35 extends from the another long side 36 of the contour toward the edge 34 of the board 12. The electrodes 35 are formed to have the same size as the size of the electrodes 28.

On the reverse surface of the board main body 19, there is formed a wiring pattern 37. The wiring pattern 37 includes conductive terminals (second conductive terminals) 38 each extending toward the edge 34. The conductive terminals 38 can reach the edge 34 of the board 12, or can be terminated at positions separated from the edge 34. The wiring pattern 37 further includes an auxiliary conductive film 39 for each of the conductive terminals 38. The auxiliary conductive films 39 are each formed so as to be separated from corresponding one of the conductive terminals 38.

On the reverse surface 12b of the board 12, there are mounted electronic components (connection members) 41 such as chip resistors or chip capacitors for the respective conductive terminals 38. The electronic components 41 each has a pair of electrodes 42, 43. The electronic components 41 are each fixed to corresponding one of the conductive terminals 38 in one electrode 42. The electronic components 41 are each fixed to corresponding one of the auxiliary conductive films 39 in the other electrode 43. In both electrodes, a conductive material 44 is used for the fixation. A solder material, for example, can be used for the conductive material 44.

It should be noted that it is also possible to use the chip resistor or the chip capacitor for improvement in output characteristics of the sensor devices.

Corresponding one of the electronic components 41 is bonded to each of the electrodes 32, 35. The one electrode of each of the electronic components 41 is fixed to corresponding one of the electrodes 32, 35 of the first or second sensor device 23, 27 with a conductive material 44a. Each of the electrodes 32, 35 of the first and second sensor devices 23, 27 is connected to corresponding one of the conductive terminals 38 via the conductive materials 44, 44a, and the electrode 42 of corresponding one of the electronic components 41. On the surface of each of the conductive terminals 38, the one electrode 42 of corresponding one of the electronic components 41 has a certain height toward corresponding one of the electrodes 32, 35 of the first and second sensor devices 23, 27.

On the reverse surface 12b of the board 12, there is mounted a third sensor device 45. The third sensor device 45 has the same structure as the structures of the first sensor device 23 and the second sensor device 27. In other wards, the third sensor device 45 has a flat cuboid outer shape. Similarly to the first and second sensor devices 23, 27, the third sensor device 45 has an outer surface 45a having a rectangular contour. The outer surface 45a of the third sensor device 45 is overlapped with the reverse surface 12b of the board 12. The third sensor device 45 is provided with a plurality of electrodes 46. The electrodes 46 are arranged in two lines along two long sides of the rectangular contour. Each of the electrodes 46 can also extend from the outer surface 45a to another outer surface (a side surface) beyond a ridge line. Each of the electrodes 46 is individually connected to corresponding one of conductive terminals 47 formed on the reverse surface 12b of the board 12. When connecting the electrodes, a bonding material 48 such as a solder material is used. The first sensor device 23, the second sensor device 27, and the third sensor device 45 are formed of angular velocity sensors having single detection axes 49a, 49b, and 49c, namely gyro sensors, respectively. In each of the angular velocity sensors, the detection axis 49a, 49b, or 49c is perpendicular to the outer surface 23a, 27a, or 45a. The combination of the first, second, and third sensor devices 23, 27, and 45 detects the angular velocities around three orthogonal axes.

On the reverse surface 12b of the board 12, there is mounted a fourth sensor device 51. The fourth sensor device 51 is formed of, for example, a triaxial acceleration sensor. The fourth sensor device 51 detects the accelerations along the three orthogonal axes.

Figure 3:
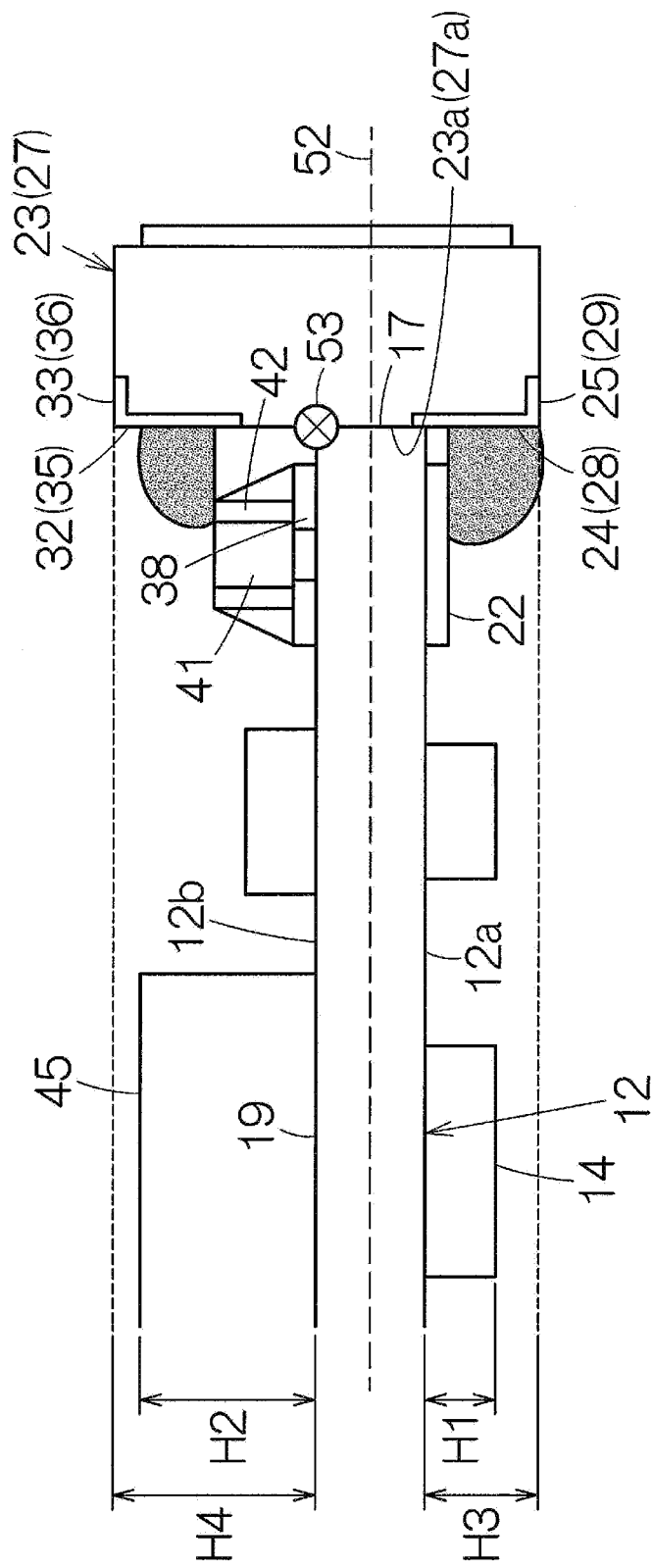
FIG. 3 is a side view of the sensor unit conceptually showing a positional relationship between a first sensor device and a second sensor device, and the board.

As shown in FIG. 3, the board 12 is displaced toward the long sides 25, 29 of the contours on the outer surfaces 23a, 27a of the first sensor device 23 and the second sensor device 27. Here, an imaginary plane 52 equally distant from the obverse surface and the reverse surface of the board main body 19 and parallel to the obverse surface and the reverse surface is displaced toward the long sides 25, 29 from the bisector 53 extending in parallel to the long sides 25, 33 (29, 36) of the contours. In accordance with the displacement, the end surface 17 of the board 12 overlaps the electrodes 24, 28 located near to the long sides 25, 29. In contrast, a blank area (a separating zone) of the conductive film is formed between the end surface 17 of the board 12 and the electrodes 32, 35 located near to the another long sides 33, 36. There occurs no overlap between the end surface 17 and the electrodes 32, 35.

Figure 4:
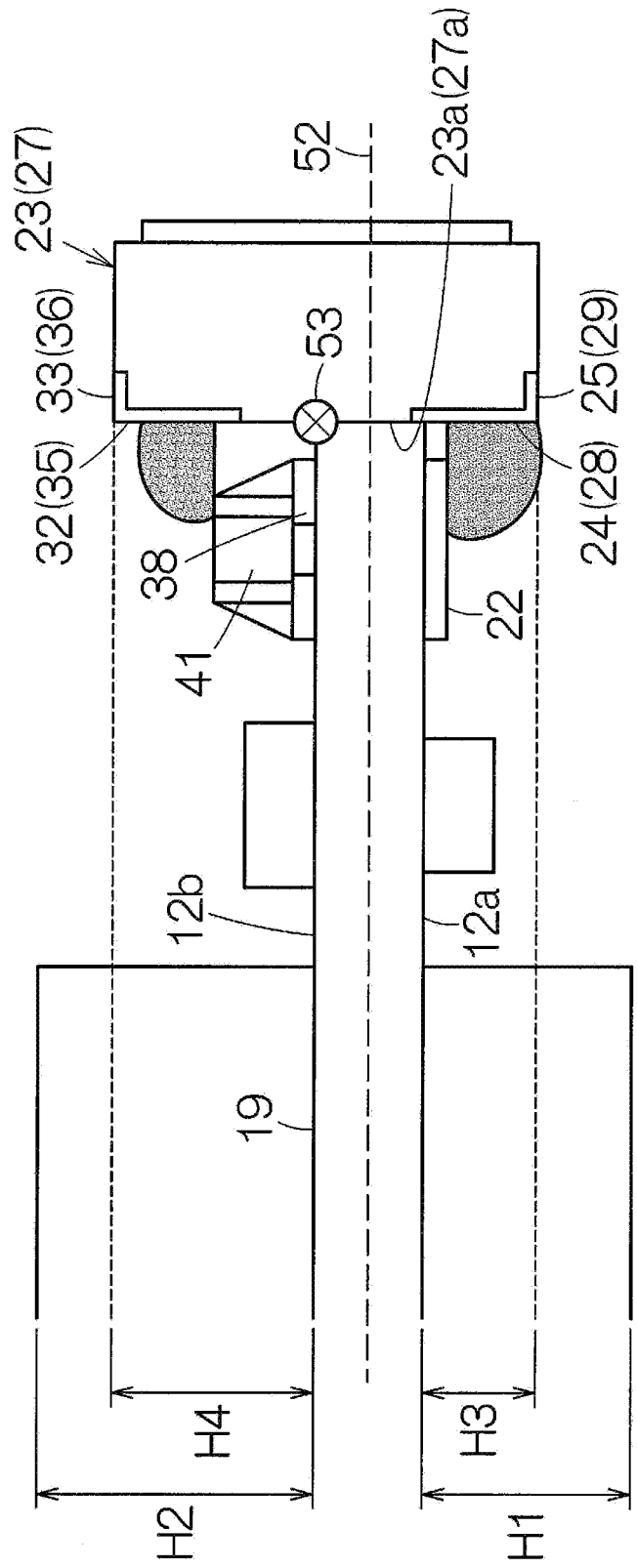
FIG. 4 is a side view of the sensor unit conceptually showing the positional relationship between the first sensor device and the second sensor device, and the board.

The connector 14 is attached to the obverse surface 12a of the board 12, and projects in a vertical direction from the obverse surface 12a of the board 12 with the maximum height H1 in an electronic component group (a first electronic component group) housed in a housing. Here, the maximum height H1 corresponds to the maximum thickness of a first electronic component. On the other hand, the third sensor device 45 projects in a vertical direction from the reverse surface 12b of the board 12 with the maximum height H2 in an electronic component group (a second electronic component group) attached to the reverse surface 12b of the board 12. Here, the maximum height H2 corresponds to the maximum thickness of a second electronic component. The height H2 of the third sensor device 45 is greater than the height H1 of the connector H1. If the maximum height H1 of the electronic component group on the obverse surface 12a and the maximum height H2 of the electronic component group on the reverse surface 12b are fitted into the projections of the first sensor device 23 and the second sensor device 27 in such a manner, the miniaturization of the sensor unit 11 can be realized. Moreover, the height H1 of the connector 14 is lower than the height (a first projection length of the outer surface) H3 of the first and second sensor devices 23, 27 projecting from the obverse surface 12a of the board 12. The height H2 of the third sensor device 45 is lower than the height (a second projection length) H4 of the first and second sensor devices 23, 27 projecting from the reverse surface 12b of the board 12. Thus, the further miniaturization of the sensor unit 11 can be realized. It should be noted that as shown in, for example, FIG. 4, as long as the maximum height H2 of the electronic component group attached to the reverse surface 12b of the board 12 is greater than the maximum height H1 of the electronic component group attached to the obverse surface 12a, no matter if the maximum heights H2, H1 are higher than the heights H4, H3 of the first and second sensor devices 23, 27, respectively, the miniaturization of the sensor unit 11 can sufficiently be achieved compared to the case in which the maximum height H2 is lower than the maximum height H1.

Figure 5:
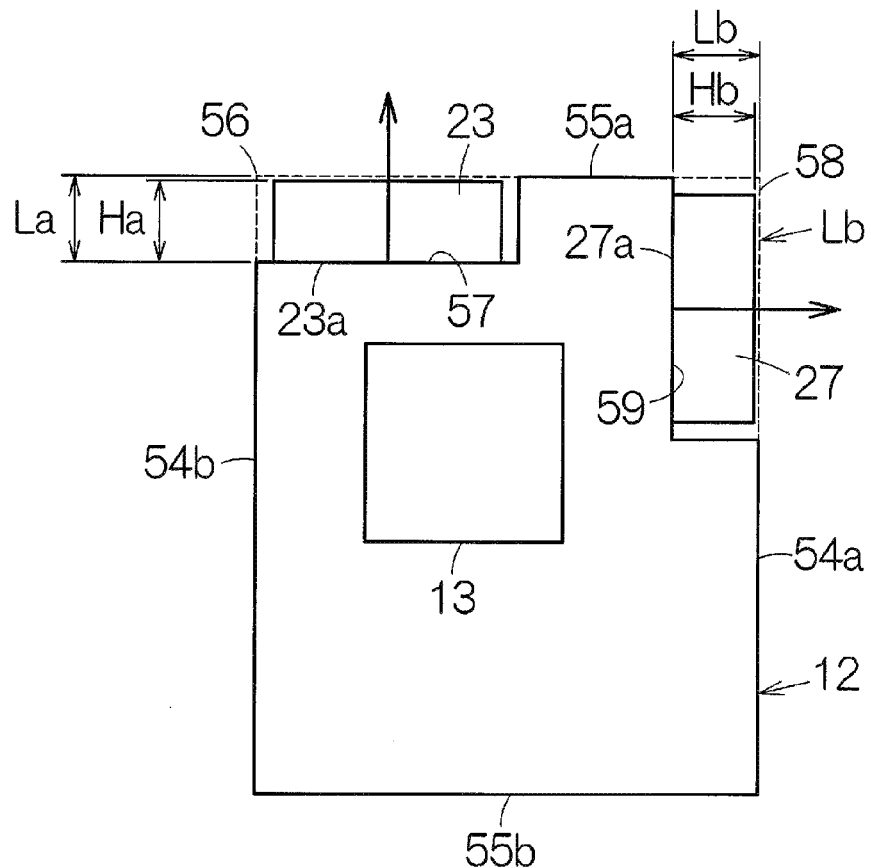
FIG. 5 is a plan view of the sensor unit conceptually showing the positional relationship between the first sensor device and the second sensor device, and the board.

As shown in FIG. 5, the board 12 is formed to have a rectangular contour. In other words, the contour of the board 12 is provided with a pair of long sides 54a, 54b, and a pair of short sides 55a, 55b. The long sides 54a, 54b extend in parallel to each other. The short sides 55a, 55b extend in parallel to each other.

Here, the long sides 54a, 54b and the short sides 55a, 55b are perpendicular to each other. It should be noted that it is also possible for the long sides 54a, 54b and the short sides 55a, 55b to intersect with each other at a tilt angle smaller than 90°. Further, it is also possible to set the four sides of a quadrangular to be equal in length to each other to form a square (or rhombic) contour. Further, the contour is not necessarily required to have a quadrangular shape, but it is sufficient for the board 12 to be formed to have a contour for realizing necessary end surfaces in accordance with the intersection angle of the detection axes required between the sensor devices. For example, even in the case of the quadrangular shape, the corners between the adjacent sides can be chamfered, or formed to have other shapes.

The first sensor device 23 is fixed to the end surface 17 of the board 12 along one short side 55a of the contour.

On this occasion, the first sensor device 23 is aligned to one corner 56 out of the two corners located across the one short side 55a. In the one short side 55a, a recessed portion 57 is provided to the rectangular contour. The recessed portion 57 has a depth La larger than the height Ha of the first sensor device 23 from the outer surface 23a. Thus, the projection of the first sensor device 23 from the typical shape of the board 12 can be avoided.

Figure 6:
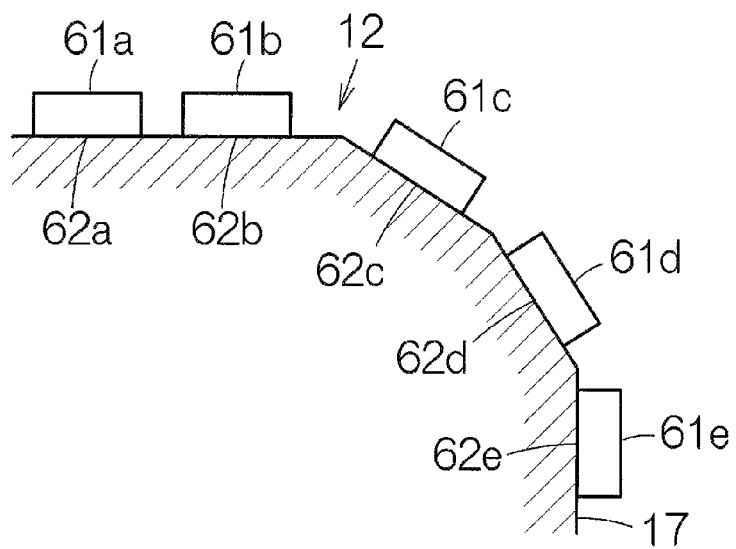
FIG. 6 is a plan view of the sensor unit conceptually showing a positional relationship between a contour and sensor devices according to a modified example.

The second sensor device 27 is fixed to the end surface 17 of the board 12 along the long side 54a of the contour. The long side 54a defines the end surface 17 extending in parallel to an imaginary plane perpendicular to the one short side 55a of the board 12. Since the first sensor device 23 and the second sensor device 27 respectively have the detection axes 49a, 49b perpendicular to the outer surfaces 23a, 27a to be the connection surfaces, it is possible for the detection axes 49a, 49b to easily constitute the orthogonal axes in accordance with the contour of the board 12. On this occasion, the second sensor device 27 is aligned to the other corner 58 out of the two corners located across the one short side 55a. As a result, the first sensor device 23 and the second sensor device 27 are disposed close to each other. The first sensor device 23 and the second sensor device 27 can be connected to the common IC chip 13 with the shortest distance. In the long side 54a, a recessed portion 59 is provided to the rectangular contour. The recessed portion 59 has a depth Lb larger than the height Hb of the second sensor device 27 from the outer surface 27a. Thus, the projection of the second sensor device 27 from the typical shape of the board 12 can be avoided. It should be noted that as shown in, for example, FIG. 6, the contour shape of the board 12 can arbitrarily be configured in accordance with the directions of the detection axes required for sensor devices 61a through 61e. The directions of the detection axes can be configured so as to be parallel to the outer surfaces 62a through 62e having contact with the end surface 17, or can be configured so as to be perpendicular thereto, or can be configured so as to have arbitrary tilt angles therewith.

In the sensor unit 11, the board 12 is displaced toward the long sides 25, 29 of the contour on the outer surfaces 23a, 27a of the first and second sensor devices 23, 27, and thus, the end surface 17 of the board 12 overlaps the electrodes 24, 28. Even in the case in which the electrodes 24, 28 are shortened, the overlap between the end surface 17 of the board 12 and the electrodes 24, 28 is kept in accordance with the displacement of the board 12. Thus, the conductive bodies 26, 31 can surely ensure the connection between the electrodes 24, 28 and the conductive terminals 22. For example, if the conductive terminals 22 extend to the edge 16 of the board 12, the conductive terminals 22 can have contact with the electrodes 24, 28. As a result, the conductive terminals 22 and the electrodes 24, 28 can surely be bonded to each other.

Moreover, in the sensor unit 11, even if the electrodes 32, 35 are shortened, the electrical connection between the conductive terminals 38 and the corresponding electrodes 32, 35 can be ensured due to the function of the electronic components 41.

Even in the case in which groups of the electrodes 24, 28 arranged in a line respectively along the long sides 25, 29 and groups of the electrodes 32, 35 arranged in a line respectively along the another long sides 33, 36 are significantly distant from each other, the electrical connection can surely be established between the conductive terminals 38 and the corresponding electrodes 32, 35 without increasing the thickness of the board 12. Further, the electronic components 41 are used for connecting such conductive terminals 38 and the electrodes 32, 35 to each other. The electronic components 41 can be selected from ready-made products. The electronic components 41 can easily be obtained without newly designing the connection members.

2. Method of Manufacturing Sensor Unit

Figure 7:
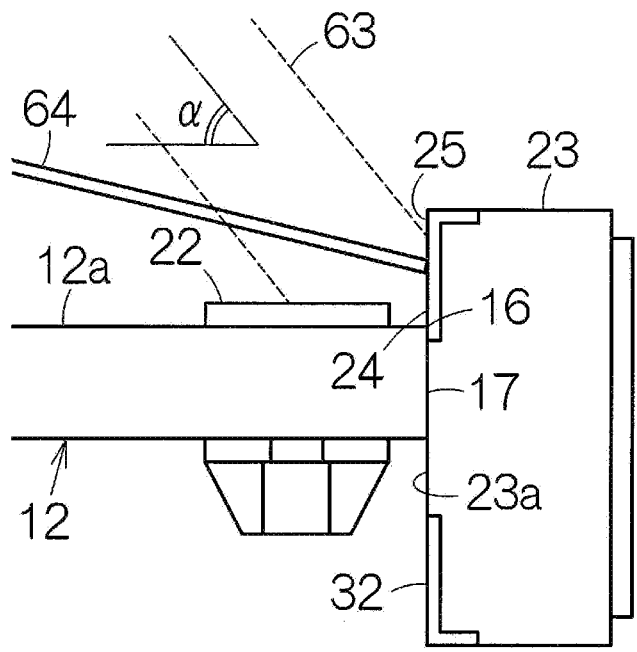
FIG. 7 is a side view schematically showing a laser beam applied to an obverse surface of the board.

Then, a method of manufacturing the sensor unit 11 will briefly be explained. As shown in FIG. 7, the board 12 and the first sensor device 23 are prepared. The board 12 is made to have contact with the outer surface 23a of the first sensor device 23 in the end surface 17. On this occasion, the board 12 is positioned so as to be displaced toward the long side 25 along the outer surface 23a of the first sensor device 23. As a result of such a displacement, the end surface 17 of the board 12 is overlapped with the electrodes 24 arranged in a line along the long side 25.

Here, the electrodes 24 and the corresponding conductive terminals 22 are irradiated with a laser beam 63. The laser beam 63 is applied from a direction tilted at a predetermined tilt angle α with the surface of the conductive terminals 22. As a result of such a tilt, the electrodes 24 and the corresponding conductive terminals 22 can simultaneously and evenly be heated. If the tilt angle α of the laser beam 63 is excessively small with respect to the conductive terminals 22, the temperature cannot sufficiently rise in the conductive terminals 22 compared to the electrodes 24. In contrast, if the tilt angle α of the laser beam 63 is excessively large with respect to the conductive terminals 22, the temperature cannot sufficiently rise in the electrodes 24 compared to the conductive terminals 22.

The conductive material to be melted with the energy of the laser beam 63 is supplied to an irradiation area of the laser beam 63. Here, thread solder 64 is disposed in the irradiation area. It is sufficient for the thread solder 64 to enter, for example, the conductive terminals 22 at a tilt angle smaller than the tilt angle of the laser beam 63. When the thread solder 64 is melted, the solder material has contact with each of the electrodes 24 and corresponding one of the conductive terminals 22. When the irradiation of the laser beam 63 is stopped, the temperature of the electrodes 24 and the conductive terminals 22 drops, and then the solder material is solidified. In such a manner as described above, the conductive bodies 31 are formed. In each of the electrodes 24 and corresponding one of the conductive terminals 22, the electrical connection is established. Relative displacement is performed between the board 12 and the first sensor device 23 in parallel to the end surface 17 of the board 12, and the electrodes 24 are sequentially bonded one by one to the corresponding conductive terminals 22.

Figure 8:
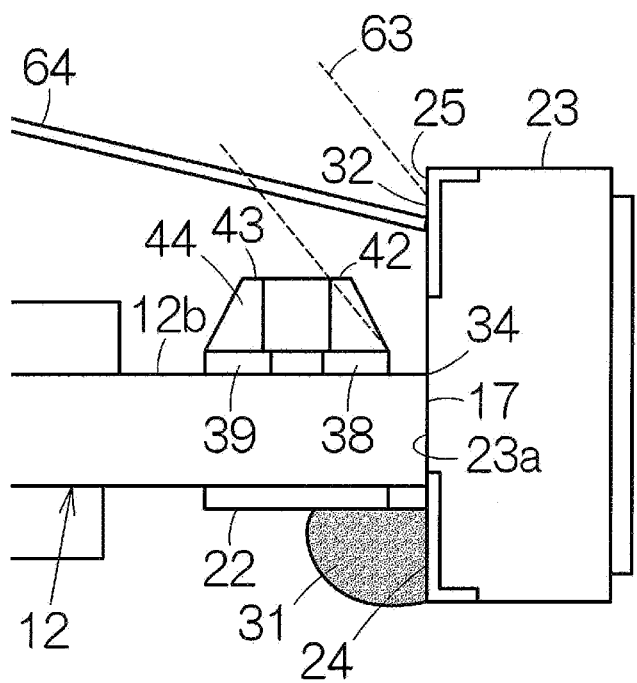
FIG. 8 is a side view schematically showing a laser beam applied to a reverse surface of the board.

Subsequently, as shown in FIG. 8, the board 12 is flipped. The conductive materials 44a is formed between each of the electrodes 32 and corresponding one of the electronic components 41 on the reverse surface 12b of the board 12 in a similar manner. Here, the electronic components 41 are mounted on the board 12 in advance with the conductive material 44. The one electrode 42 of each of the electronic components 41 and corresponding one of the electrodes 32 of the first sensor device 23 are irradiated with the laser beam 63. In each of the electronic components 41, even if the one electrode 42 is heated, the heat transfer to the other electrode 43 can be inhibited. Therefore, even in the case in which the heating by the laser beam 63 is in progress, the conductive material 44 can be prevented from melting in the other electrode 43 and the auxiliary conductive film 39. The other electrode 43 continues to be fixed to the auxiliary conductive film 39. In such a manner as described above, the position shift of the electronic component 41 can be prevented even when the heating is in progress. It should be noted that it is sufficient for the second sensor device 27 to be fixed to the end surface 17 of the board 12 using a similar method as in the first sensor device 23.

Figure 9:
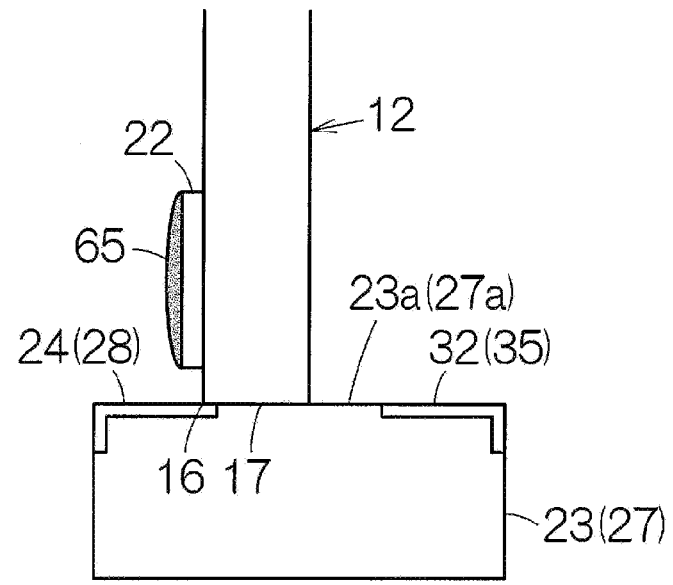
FIG. 9 is a side view conceptually showing a fixing method according to another embodiment of the invention.

Besides the above, as shown in FIG. 9, the board 12 can be held in a vertical posture. In this case, the end surface 17 of the board 12 is pressed against the outer surface 23a, 27a of the first sensor device 23 or the second sensor device 27. The outer surface 23a, 27a of the first sensor device 23 or the second sensor device 27 is disposed horizontally so as to face upward. It is sufficient to coat the conductive terminals 22 with the solder paste 65 in advance. When the solder paste is heated to melt, the solder material extends to the electrode 24 due to the action of gravity. In this case, even if the blank area of the conductive film is formed between the edge 16 of the board 12 and each of the conductive terminals 22, the solder material can extend from the conductive terminal 22 to the corresponding electrode 24 straddling the blank area of the conductive film. On this occasion, since the end surface 17 of the board 12 overlaps the electrode 24, the solder material dropping from the conductive terminal 22 surely lands on the electrode 24. In such a manner as described above, the electrical connection can surely be ensured between each of the electrodes 24 and the corresponding conductive terminal 22.

3. Modified Examples of Connection Member

Figure 10:
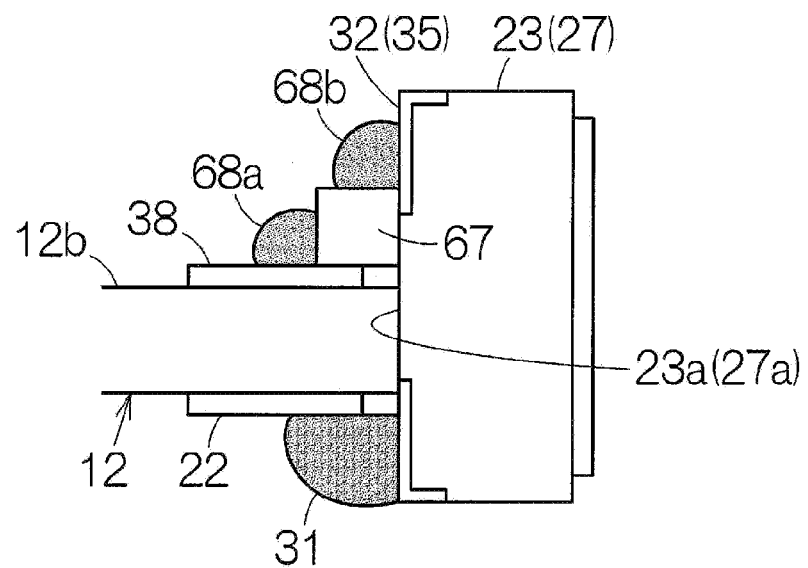
FIG. 10 is a side view of a sensor unit schematically showing a connection member according to a first modified example.

FIG. 10 is a diagram schematically showing a connection member 67 according to a first modified example. The connection member 67 is formed of a conductive body. The connection members 67 are each fixed to corresponding one of the conductive terminals 38 in the reverse surface 12b of the board 12. Similarly, the connection member 67 is fixed to each of the electrodes 32, 35 of the first sensor device 23 or the second sensor device 27. In both electrodes, conductive materials 68a, 68b are used for the fixation. Solder, for example, can be used as the conductive materials 68a, 68b. Each of the electrodes 32, 35 of the first and second sensor devices 23, 27 is connected to corresponding one of the conductive terminals 38 via the conductive materials 68a, 68b, and the connection member 67. On the surface of each of the conductive terminals 38, the connection member 67 has a certain height toward corresponding one of the electrodes 32, 35 of the first and second sensor devices 23, 27. Such a connection member 67 can be formed of a single conductive material. The connection member 67 can be designed with relative ease. The connection member can easily be manufactured.

Figure 11:
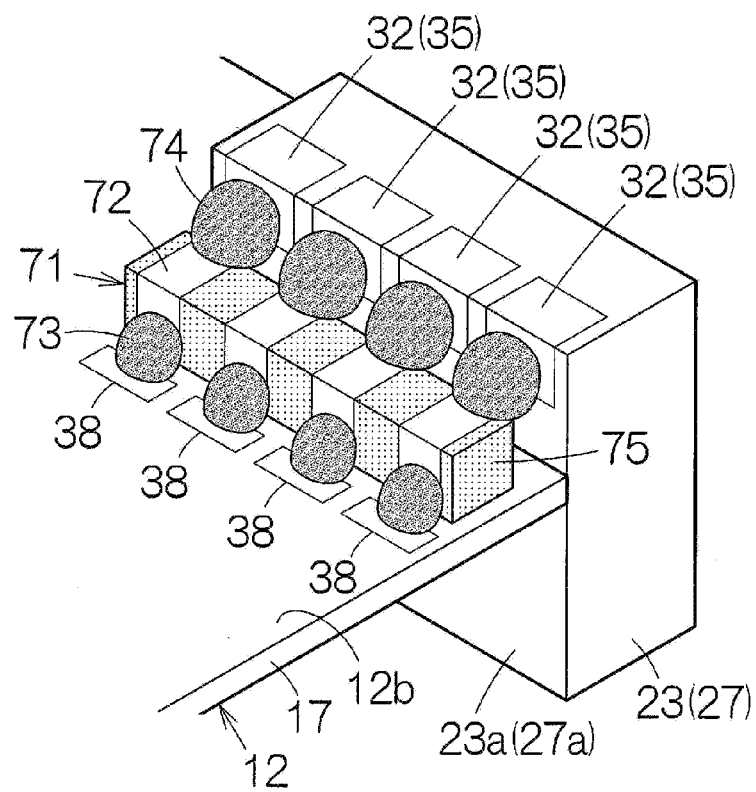
FIG. 11 is a partial perspective view of a sensor unit schematically showing a connection member according to a second modified example.

FIG. 11 is a diagram schematically showing a connection member 71 according to a second modified example. The connection member 71 is provided with conductive films 72 individually fixed to the respective conductive terminals 38. Conductive materials 73, for example, are used for the fixation. Each of the conductive films 72 is simultaneously fixed to corresponding one of the electrodes 32, 35 of the first sensor device 23 or the second sensor device 27. Conductive materials 74, for example, are used for the fixation.

The conductive films 72 are supported by a common insulating body 75. On the insulating body 75, the conductive films 72 are separated from each other. In such a manner as described above, the connection member 71 can be used commonly to a plurality of conductive terminals 38. The fixation operation can be eased compared to the case in which the connection members 71 are individually fixed to the respective conductive terminals 38.

4. Application Example of Sensor Unit

Figure 12:
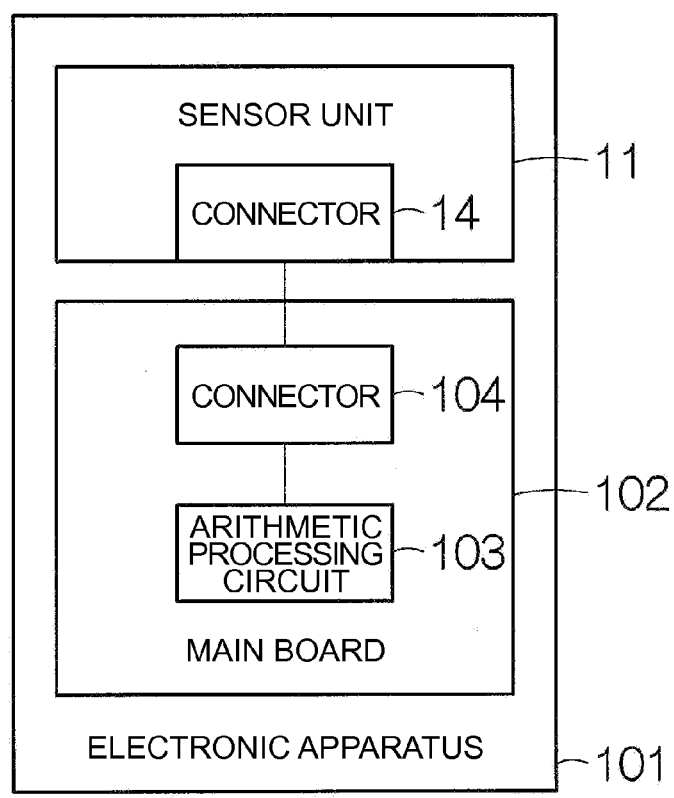
FIG. 12 is a block diagram schematically showing a configuration of an electronic apparatus according to an embodiment of the invention.

Such a sensor unit 11 as described hereinabove can be used while being incorporated in an electronic apparatus 101 as shown in, for example, FIG. 12. In the electronic apparatus 101, an arithmetic processing circuit 103 and a connector 104 are mounted on, for example, a main board 102. The connector 14 of the sensor unit 11, for example, can be connected to the connector 104. The arithmetic processing circuit 103 can be supplied with the detection signal from the sensor unit 11. The arithmetic processing circuit 103 processes the detection signal from the sensor unit 11, and then outputs the processing result. As examples of the electronic apparatus 101, there can be cited, for example, a motion sensing unit, a consumer gaming machine, a motion analysis device, a surgical operation navigation system, and a vehicle navigation system.

Figure 13:
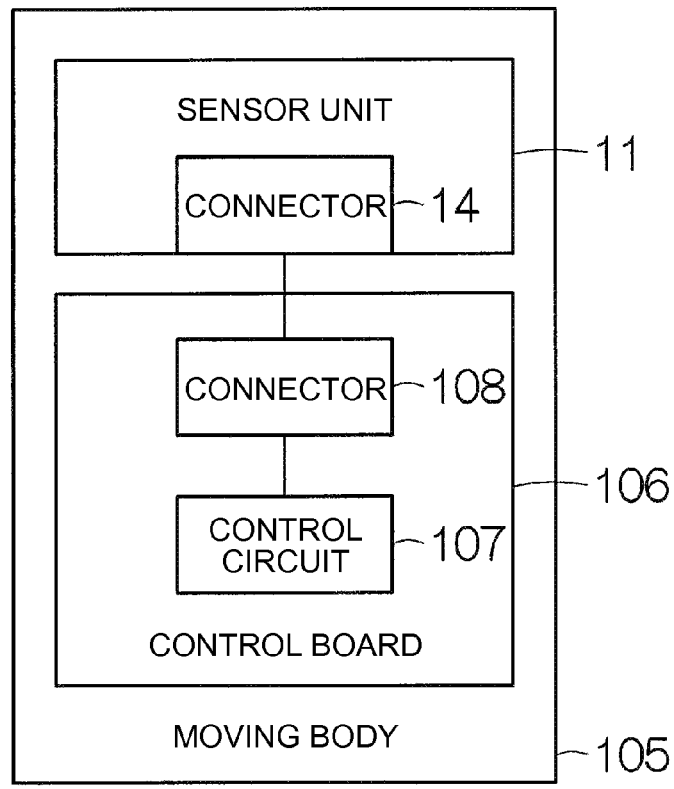
FIG. 13 is a block diagram schematically showing a configuration of a moving object according to an embodiment of the invention.

As shown in, for example, FIG. 13, the sensor unit 11 can be used while being incorporated in a moving object 105. In the moving object 105, a control circuit 107 and a connector 108 are mounted on, for example, a control board 106. The connector 14 of the sensor unit 11, for example, can be connected to the connector 108. The control circuit 107 can be supplied with the detection signal from the sensor unit 11. The control circuit 107 is capable of processing the detection signal from the sensor unit 11, and then controlling the motion of the moving object 105 in accordance with the processing result. As examples of such control, there can be cited behavior control of the moving object, vehicle navigation control, start control of a vehicle air-bag system, inertial navigation control of an airplane and a ship, guidance control, and so on.

Figure 14:
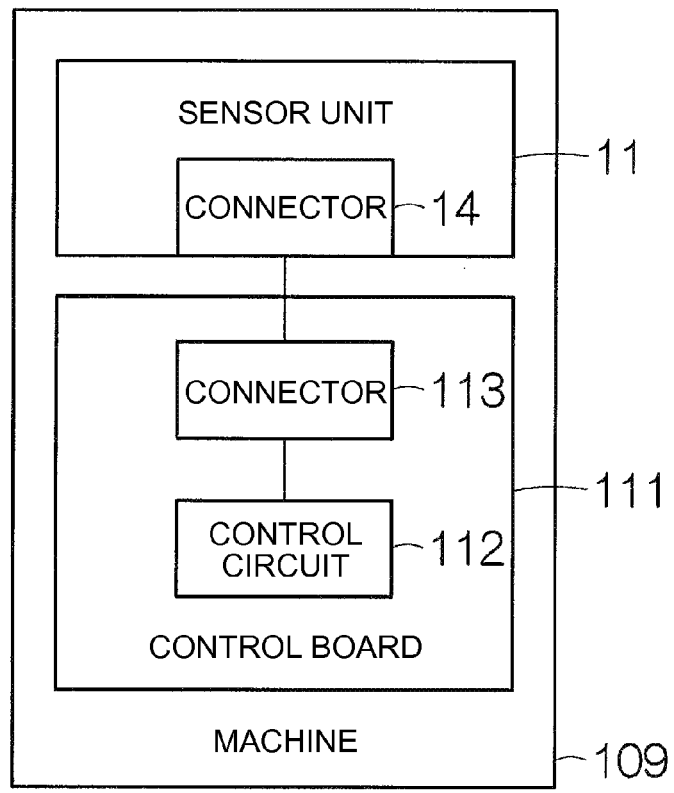
FIG. 14 is a block diagram schematically showing a configuration of a machine according to an embodiment of the invention.

As shown in, for example, FIG. 14, the sensor unit 11 can be used while being incorporated in a machine 109. In the machine 109, a control circuit 112 and a connector 113 are mounted on, for example, a control board 111. The connector 14 of the sensor unit 11, for example, can be connected to the connector 113. The control circuit 112 can be supplied with the detection signal from the sensor unit 11. The control circuit 112 is capable of processing the detection signal from the sensor unit 11, and then controlling the operation of the machine 109 in accordance with the processing result. As examples of such control, there can be cited vibration control and motion control of an industrial machine, motion control of a robot, and so on.

It should be noted that although the present embodiment is hereinabove explained in detail, it should easily be understood by those skilled in the art that it is possible to make a variety of modifications not substantially departing from the novel matters and the advantages of the invention. Therefore, such modified examples are all included in the scope of the invention. For example, a term described at least once with a different term having a broader sense or the same meaning in the specification or the accompanying drawings can be replaced with the different term in any part of the specification or the accompanying drawings. Further, the configurations and the operations of the sensor unit 11, the board 12, the first and second sensor devices 23, 27, the electronic components 41, and so on are not limited to those explained in the present embodiment, but can variously be modified.

The entire disclosure of Japanese Patent Application No. 2013-110293, filed May 24, 2013 is expressly incorporated by reference herein.

What is claimed is:

1. A sensor unit comprising:
   a first sensor device provided with a first electrode disposed on an outer surface and a second electrode disposed on the outer surface; and
   a board having:
      a first board surface and a second board surface opposite to each other;
      a first board side surface that is continuously formed between the first and second board surfaces;
      a first conductive terminal arranged at a peripheral of the first board surface next to the first board side surface; and
      a second conductive terminal arranged at a peripheral of the second board surface next to the first board side surface, wherein
   the first board side surface abuts the outer surface of the first sensor device so that the outer surface is divided into first and second divided outer surfaces,
   the first and second electrodes are disposed on the first and second divided outer surfaces, respectively,
   the first and second electrodes are electrically connected to the first and second conductive terminals via first and second conductive bodies, respectively,
   the second electrode and the second conductive terminal are electrically connected to each other via the second conductive body and a connection member, and the connection member is at least one of a chip resistor and a chip capacitor, and
   a first projection length of the first divided outer surface that is projected out from a side of the first board surface is smaller than a second projection length of the second divided outer surface that is projected out from a side of the second board surface.

2. The sensor unit according to claim 1, wherein
   a first electronic component is mounted on the first board surface of the board, and
   a maximum thickness of the first electronic component is equal to or smaller than the first projection length.

3. The sensor unit according to claim 1, wherein
   a second electronic component is mounted on the second board surface of the board, and a maximum thickness of the second electronic component is equal to or smaller than the second projection length.

4. The sensor unit according to claim 1, further comprising:
a second sensor device wherein
the board has a second board side surface that is continuously formed between the first and second board surfaces, and the second board side surface intersects the first board side surface, and
the second sensor device is disposed a on the second board side surface.

5. The sensor unit according to claim 4, wherein
the board has a rectangular shape, and
the first sensor device and the second sensor device are disposed respectively on the first and second board side surfaces so that the first sensor device and the second sensor device are located adjacent to each other.

6. The sensor unit according to claim 1, wherein
the first board side surface has a cut-out in which the first sensor device is disposed, and
a depth of the cut-out is larger than a thickness of the first sensor device.

7. The sensor unit according to claim 1, further comprising:
a third sensor device that is mounted on one of the first board surface and the second board surface, and
an integrated circuit that is mounted on the other of the first board surface and the second board surface.

8. An electronic apparatus comprising:
the sensor unit according to claim 1.

9. A moving object comprising:
the sensor unit according to claim 1.

10. A method of manufacturing a sensor unit, comprising:
providing a sensor device having a first electrode disposed on an outer surface and a second electrode disposed on the outer surface;
providing a board, the board having:
a first board surface and a second board surface opposite to each other;
a board side surface that is continuously formed between the first and second board surfaces;
a first conductive terminal arranged at a peripheral of the first board surface next to the board side surface; and
a second conductive terminal arranged at a peripheral of the second board surface next to the board side surface;
disposing the outer surface of the sensor device on the board side surface of the board so that the outer surface is divided into first and second divided outer surfaces, the first and second electrodes being disposed on the first and second divided outer surfaces, respectively;
irradiating obliquely the first conductive terminal and the first electrode with a laser beam to melt a conductive material to form a first conductive body adapted to connect the first electrode and the first conductive terminal to each other irradiating obliquely the second conductive terminal and the second electrode with the laser beam to melt a conductive material to form a second conductive body adapted to connect the second electrode and the second conductive terminal to each other, wherein
the second electrode and the second conductive terminal are electrically connected to each other via the second conductive body and a connection member, and the connection member is at least one of a chip resistor and a chip capacitor, and
a first projection length of the first divided outer surface that is projected out from a side of the first board surface is smaller than a second projection length of the second divided outer surface that is projected out from a side of the second board surface.

\* \* \* \* \*